April 29, 1969 E. J. SENG 3,440,715

METHOD OF FABRICATING INTEGRATED CIRCUITS BY CONTROLLED PROCESS

Filed Aug. 22, 1967

INVENTOR
E. J. SENG
BY David P. Kelley
ATTORNEY

United States Patent Office 3,440,715

Patented Apr. 29, 1969

3,440,715
METHOD OF FABRICATING INTEGRATED CIRCUITS BY CONTROLLED PROCESS

Edward J. Seng, Schnecksville, Pa., assignor to Bell Telephone Laboratories, Incorporated, Murray Hill, N.J., a corporation of New York Filed Aug. 22, 1967, Ser. No. 662,326
Int. Cl. B01j 17/00; H01l 7/00
U.S. Cl. 29—574 3 Claims

ABSTRACT OF THE DISCLOSURE

The disclosure is a method of controlling emitter diffusion during the fabrication of transistors or integrated circuits. The problem of making electrical contact with the base region immediately after emitter diffusion, the base being covered with silicon dioxide, is solved by diffusing two emitter regions into the base region, thereby forming a pair of PN junctions. A voltage is applied across the two emitter regions sufficient in magnitude to reverse bias into breakdown one of the PN junctions, thereby providing electrical contact to the base region and allowing the measurement of current gain.

*Background of the invention*

This invention relates to the manufacture of solid state circuits and particularly to a method of controlling emitter diffusion in the fabrication of monolithic integrated transistor circuits.

Monolithic integrated circuits, i.e., circuits that are complete on a single piece of semiconductor material, like many types of high frequency transistors, are usually manufactured in batches on wafers of semiconductor material to facilitate handling and processing. Present process control methods include in most cases making resistivity and thickness measurements on diffused regions and regions deposited and defined by various thin film techniques.

Many of the process control methods in integrated circuit processing require the destruction of several integrated circuits per wafer at many of the manufacturing steps in order to monitor properly the processes. The tests in addition to being destructive in some cases are very time consuming as well. To check a diffusion step in the preparation of a PN junction, for example, a customary procedure has been to cut out several integrated circuit chips from the wafer, strip the oxide formed during diffusion from them and measure the sheet resistance of the diffused regions. The semiconductor material of the chip is then lapped away at an angle, stained for contrast, and the stained region measured with an interferometer to determine the depth of diffusion. In general, any testing procedures requiring the removal of a chip from a wafer-in-process may be considered as destructive since when the chips are no longer a part of the wafer they cannot be completed and are therefore of little value other than as scrap.

It is, of course, possible to obtain information on the nature of the processing steps by making measurements on the components of the circuit at various stages of manufacture, and it may not, therefore, be necessary to remove the chip from the wafer. However, where integrated circuits are to be tested, it is necessary, since integrated circuits and their components are usually quite small, that temporary electrical contact be made to them for in-process testing purposes.

There are other process control methods in which test wafers of silicon are processed concurrently with the integrated circuit wafer but these test wafers do not yield the quality of information provided by portions of the integrated circuit wafer itself since the material and processing constants will usually differ slightly. For example, there may be slight differences in the resistivity and uniformity of the wafers, and so forth.

Moreover, the testing of individual parts of an integrated circuit is further complicated by the fact that some of them are completely covered by several layers of protective oxide material which makes these parts virtually inaccessible unless special ohmic contacts are brought through oxides. In the fabrication of a planar silicon transistor, for example, it is desirable to measure the characteristics (e.g., gain and base width) of the transistor immediately after the emitter diffusion step in the event that the characteristics do not conform to predetermined requirements and a rediffusion is necessary. Immediately following emitter diffusion, however, the base region is covered by several layers of silicon dioxide. It is customary in the prior art to make electrical contact to the base region by etching away a window in the silicon dioxide by well-known photoresist techniques. The base region is thereby exposed and electrical measurements are made. In the event that the transistor characteristics are substandard, however, it would be necessary to redeposit silicon dioxide over the exposed base region before rediffusing the emitter region. This additional step of redepositing the oxide is both expensive and time consuming and therefore undesirable.

Accordingly, one object of this invention is to control the fabrication of solid state circuits by a method which is simple, convenient, nondestructive and valid.

A more specific object is to control the emitter diffusion of planar transistors by a method which allows the measurement of transistor characteristics immediately following the emitter diffusion step.

*Summary of the invention*

The invention features a method of verifying that integrated circuit fabrication processes and components in an integrated circuit on a particular wafer of semiconductor material meet specifications by analyzing special evaluation components prepared on the same wafer but which are not functional parts of the integrated circuit.

In accordance with one aspect of the invention, during the emitter diffusion step in the fabrication of planar transistors, two emitter regions are diffused into the base region of each evaluation transistor. Although the base region of all transistors is covered by silicon dioxide, electrical contact is made to the base region of an evaluation transistor by applying a voltage of sufficient magnitude to reverse bias into breakdown one of the emitter-base junctions. Because the one junction is biased into breakdown, current flows in the base region thereby allowing the measurement of the transistor gain from which may be determined other transistor parameters such as base width. Should the transistor characteristics be substandard, the emitter regions may be rediffused immediately since the base regions are still covered by protective oxide layers.

*Brief description of the drawing*

The above and other objects of the invention, together with its various features and advantages, can be easily understood from the following more detailed discussion, taken in conjunction with the accompanying drawing, in which.

*Detailed description*

In accordance with the invention, integrated circuit transistors manufactured in batch-type processing, in which a large number of transistors or transistor circuits are formed on discrete areas on a wafer of silicon, may be monitored during processing and evaluated for quality by testing a number of especially designed evaluation transistors which are formed on discrete areas of the wafer as a part of the integrated circuit processing.

Figure 1:
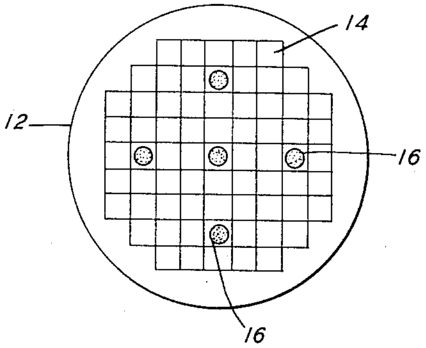
FIG. 1 shows a wafer which includes a large number of integrated circuits and which has five integral evaluation transistors on it.

Typically, integrated circuits are prepared, as shown in FIG. 1, in a batch on a wafer 12 of silicon. Customarily each square 14 becomes an integrated transistor or transistor circuit. A single thin disc-shaped wafer approximately an inch in diameter may have several hunderd or more individual integrated circuits formed on it. Near the end of the process, these are subsequently cut or otherwise separated from the wafer into separate discrete units called chips.

The present invention involves the substitution of evaluation transistors for a few of the transistors on the wafer, the evaluation transistors to be used for testing purposes. The circled regions 16 on the wafer 12 are shown in this manner simply to illustrate or represent typical locations of such evaluation transistors. Testing of the processes used in the fabrication of the integrated transistors is performed on the evaluation transistors rather than on any of the integrated transistors or transistor circuits.

Figure 2:
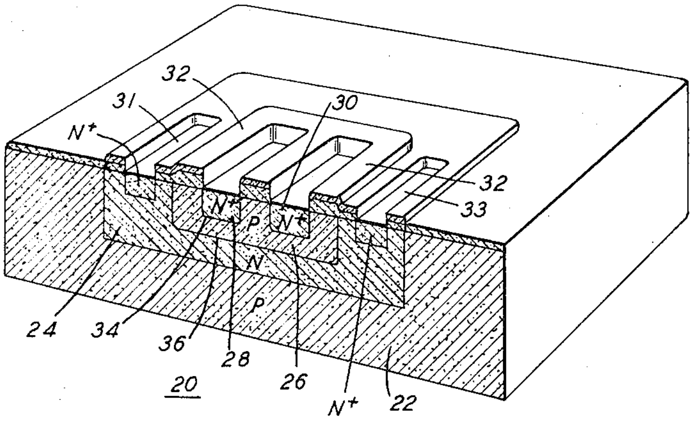
FIG. 2 is a cross-sectional view of an evaluation transistor fabricated in accordance with the invention.

The evaluation transistors and the functional transistors are fabricated concurrently in the same processing operations, and up to the emitter diffusion step both types of transistors are substantially identical. As will be described more fully below, the base region of all the transistors following emitter diffusion is covered by silicon dioxide preventing electrical contact thereto. However, in accordance with the invention, during emitter diffusion, two (or more) emitters are diffused into each evaluation transistor. By applying a voltage across the two emitter regions electrical contact is made to the base region of the evaluation transistor in a manner to be more fully described in conjunction with the detailed process steps which follow. Referring to FIG. 2, a typical evaluation transistor 20, as well as a typical functional transistor, is fabricated by growing an n-type epitaxial film (not shown) about 12 microns thick on a p-type substrate 22 which is actually part of a p-type wafer. Commonly used substrates are silicon 6 to 8 mils thick with a resistivity of approximately 10 ohm cm. The epitaxial layer is also silicon, approximately 0.5 mil thick, with a resistivity on the order of 0.5 ohm cm. and will ultimately become the collector region 24 of the transistor.

A thin (5000 A.) film of silicon dioxide is then thermally grown over the epitaxial layer. This film will serve as the vehicle for the photolithographic masking process necessary for the formation of the base and emitter regions of the transistor.

In the photolithographic process parts of the silicon dioxide film are etched away leaving isolated regions of $SiO_2$. The remaining $SiO_2$ serves as a mask for the isolation diffusion step which follows. The wafer is then exposed to a p-type diffusant, typically boron. The diffusant penetrates into the silicon only in those areas in which the $SiO_2$ was removed by the etchant. The areas under the $SiO_2$ are not exposed to the diffusant. The area that remains covered with $SiO_2$ is now an isolated island of n-type silicon (i.e., the collector region 24) surrounded by p-type silicon (i.e., the substrate 22). Subsequent to the diffusion cycle a new layer of $SiO_2$ is grown over the diffused p-type region, and the preexisting oxide over the n-type regions grows thicker.

A second pattern to form the transistor base region 26 is etched into the $SiO_2$ layer using the well-known photolithographic process. Next, p-type impurities are again diffused through the etched openings into the collector islands of n-type silicon to form the base region 26. A layer of silicon dioxide is again grown over the diffused p-type regions and is selectively etched to open windows in the base region 26 to permit the diffusion of n-type impurities (e.g., phosphorus) for the formation of the transistor emitters in the base region 26. Similarly, windows are simultaneously opened in the collector region 24 to permit the formation of contact regions 31 and 33.

At this stage of the transistor fabrication, all the transistors on the wafer, including both the functional and the evaluation transistors, are substantially identical. In the emitter diffusion step which follows, however, two (or more) emitter regions 28 and 30 are diffused into the base region 26 of the evaluation transistors. The other transistors generally, although not necessarily, have only a single emitter. After the emitter diffusion has been completed it is desirable to measure the characteristics of the transistors to determine whether or not they meet specification. For example, from a measurement of base width or gain it can be determined whether or not a subsequent emitter diffusion is necessary.

The base width can be determined by measuring the current gain of the transistor, or vice versa, but to measure the gain it is necessary to make electrical contact to the base region 26 which is covered by several layers 32 of silicon dioxide. In accordance with the invention a voltage is applied across the two emitter regions 28 and 30 of the evaluation transistor 20. The voltage is of sufficient magnitude (e.g., 7 volts) to reverse bias into breakdown one of the PN junctions (e.g., junction 34).

Figure 3:
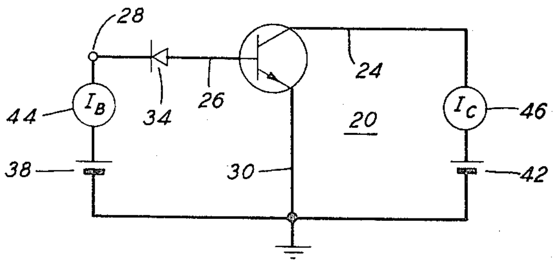
FIG. 3 is a schematic of the evaluation transistor of FIG. 2.

FIG. 3 shows schematically the evaluation transistor 20 of FIG. 2. Identical numerals have been used to designate corresponding parts. The diode 34 of FIG. 3 corresponds to the PN junction 34 of FIG. 2 which is reverse biased into breakdown. In order to measure the current gain, the emitter region 30 is grounded, the emitter region 28 is connected through a voltage source, designated by the battery 38, to ground; and the collector region 24 is connected through a battery 42 to ground. The current is measured by ammeters 44 and 46 connected respectively in the base and collector circuits. The voltage of battery 38 is sufficient in magnitude to reverse bias into breakdown the diode 34. With the PN junction 34 in breakdown, current is made to flow through the base region 26. In this manner, although physical contact to the base region 26 is not made, the current gain can be measured since electrical "contact" is accomplished via the breakdown of junction 34. From the measurement of current gain the base width (i.e., the distance between junctions 34 and 36) can be determined.

In a similar manner each evaluation transistor on the wafer is tested to determine the base width and consequently the depth of the emitter diffusion. Should the base width not meet specification, emitter rediffusion can be performed immediately since the base region 26 of each transistor is still covered by several oxide layers 32. Subsequent measurements and rediffusions are of course readily performed if necessary. The base width of the evaluation transistors measured by the aforementioned technique is to a high degree of approximation the base width of all the transistors on the same wafer.

Unlike the angle lapping technique, the present method is nondestructive, not time consuming, more economical and more accurate. Unlike the four-point probe method, the present invention permits the measurement of transistor characteristics immediately after emitter diffusion. The additional photoresist step and reoxidizing step required in that method are eliminated.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

What is claimed is:

1. A method of determining the separation distance between parallel planes formed by pairs of superposed PN junctions on a semiconductor substrate by determining the separation of other PN junctions formed on said substrate concurrently in the same processing operations, said method comprising the steps of:
   diffusing an elongated and uniform region of one conductivity type into a region of a second conductivity type in a semiconductor substrate, said diffusion extending into the semiconductor material from the surface thereof and forming a PN junction with said second conductivity type region and with said PN junction extending from said surface to a depth *a*,
   selectively diffusing over parts of said elongated region at least two separated regions of second conductivity type material in such a manner as to form PN junctions with said first conductivity type material at a distance *b* from the surface of said semiconductor material and less than the distance *a*, thereby creating a plurality of buried regions of said one conductivity type material,
   applying a voltage across two of said separated regions sufficient in magnitude to reverse bias into breakdown one of said PN junctions at distance *b*, and
   making electrical gain measurements from which can be determined the thickness of said buried regions, said thickness being the distance *a–b* which to a high degree of approximation is the separation distance between all of said superposed PN junctions.

2. A method of determining the current gain of planar transistors formed on a single wafer by determining the gain of evaluation transistors formed on said wafer concurrently in the same processing operations, said method comprising the steps of:
   forming a collector region on a semiconductor substrate,
   diffusing a base region into said collector region,
   selectively diffusing into said base region of said evaluation transistors at least two separated emitter regions, thereby forming at least two emitter-base junctions,
   applying a voltage across two of said separated emitter regions sufficient in magnitude to reverse bias into breakdown one of said emitter-base junctions, and
   making electrical gain measurements on said evaluation transistor which to a high degree of approximation is the gain of all of said planar transistors formed on said wafer.

3. The method of claim 2 wherein the gain of said transistors is determined to be substandard and in combination with the additional step of immediately rediffusing said emitter regions of all of said transistors until the gain thereof meets specification.

References Cited

UNITED STATES PATENTS 3,304,594 2/1967 Madland ------------ 29—577

CHARLIE T. MOON, *Primary Examiner.*

U.S. Cl. X.R.

324—158; 148—1.5